United States Patent
Gottsche et al.

(10) Patent No.: US 7,416,927 B2
(45) Date of Patent: Aug. 26, 2008

(54) METHOD FOR PRODUCING AN SOI FIELD EFFECT TRANSISTOR

(75) Inventors: Ralf Gottsche, Munich (DE); Christian Pacha, Munich (DE); Thomas Schulz, Austin, TX (US); Werner Steinhogl, Munich (DE)

(73) Assignee: Infineon Technologies AG (DE)

( * ) Notice: Subject to any disclaimer, the term of this patent is extended or adjusted under 35 U.S.C. 154(b) by 214 days.

(21) Appl. No.: 10/948,637

(22) Filed: Sep. 23, 2004

(65) Prior Publication Data
US 2005/0106789 A1 May 19, 2005

Related U.S. Application Data

(63) Continuation of application No. PCT/DE03/00933, filed on Mar. 20, 2003.

(30) Foreign Application Priority Data
Mar. 26, 2002 (DE) ............................ 102 13 545

(51) Int. Cl.
*H01L 21/84* (2006.01)
*H01L 21/00* (2006.01)
(52) U.S. Cl. .................. 438/154; 438/163; 438/230; 438/303
(58) Field of Classification Search .............. None
See application file for complete search history.

(56) References Cited

U.S. PATENT DOCUMENTS

| | | | |
|---|---|---|---|
| 4,838,993 A * | 6/1989 | Aoki et al. | 438/299 |
| 5,273,915 A | 12/1993 | Hwang et al. | |
| 5,341,028 A * | 8/1994 | Yamaguchi et al. | 257/344 |
| 5,528,053 A | 6/1996 | Schwalke | |

(Continued)

FOREIGN PATENT DOCUMENTS

DE 198 23 212 A1 1/1999

(Continued)

OTHER PUBLICATIONS

Hamada et al.; "Utilizing Surplus Timing for Power Reduction"; Proceedings of the IEEE Custom Integrated Circuits Conference 2001.

(Continued)

*Primary Examiner*—Zandra Smith
*Assistant Examiner*—Khanh B Duong
(74) *Attorney, Agent, or Firm*—Dickstein, Shapiro, LLP.

(57) ABSTRACT

Method for producing a first SOI field effect transistor with predetermined transistor properties by forming a laterally delimited layer sequence with a gate-insulating layer and a gate region on an undoped substrate, forming a spacer layer having a predetermined thickness, on at least a portion of the sidewalls of the laterally delimited layer sequence, and forming two source/drain regions having a predetermined dopant concentration profile, by introducing dopant into two surface regions of the substrate which are adjoined by the spacer layer, the layer sequence and the spacer layer forming a shading structure that prevents dopant from being introduced into a surface region of the substrate between the two source/drain regions, wherein the predetermined transistor properties of the first SOI field effect transistor are set by setting the thickness of the spacer layer and by setting the dopant concentration profile.

8 Claims, 10 Drawing Sheets

U.S. PATENT DOCUMENTS

| | | | |
|---|---|---|---|
| 5,532,175 A | 7/1996 | Racanelli et al. | |
| 5,841,170 A * | 11/1998 | Adan et al. | 257/345 |
| 5,960,319 A * | 9/1999 | Iwata et al. | 438/664 |
| 6,090,648 A * | 7/2000 | Reedy et al. | 438/155 |
| 6,150,202 A * | 11/2000 | Imai et al. | 438/154 |
| 6,159,815 A * | 12/2000 | Lustig et al. | 438/305 |
| 6,331,468 B1 * | 12/2001 | Aronowitz et al. | 438/287 |
| 6,406,951 B1 * | 6/2002 | Yu | 438/183 |
| 6,465,292 B2 * | 10/2002 | Maeda et al. | 438/197 |
| 6,562,676 B1 * | 5/2003 | Ju | 438/232 |
| 6,579,750 B1 * | 6/2003 | Krivokapic | 438/149 |
| 6,919,236 B2 * | 7/2005 | Wei et al. | 438/149 |
| 6,975,014 B1 * | 12/2005 | Krivokapic et al. | 257/510 |

FOREIGN PATENT DOCUMENTS

| | | |
|---|---|---|
| DE | 198 57 059 A1 | 6/1999 |
| EP | 0 973 204 A2 | 1/2000 |
| JP | 4-177873 A | 6/1992 |
| JP | 7-335903 A | 12/1995 |
| JP | 9-237899 A | 9/1997 |

OTHER PUBLICATIONS

Schiml et al.; "A 0.13um CMOS Platform with CU/Low-k Interconnects for System On Chip Applications"; 2001 Symposium on VLSI Technology Digest of Technical Papers.

Nuernbergk et al.; "Manche mogen's heiss-Silicon-on-Insulator-Bauelemente und ihre Besonderheiten"; Mikroelektronik-Fertigung, pp. 61-64.

* cited by examiner

F = 150 nm
ΔF = 20 nm

F = 50 nm
ΔF = 20 nm

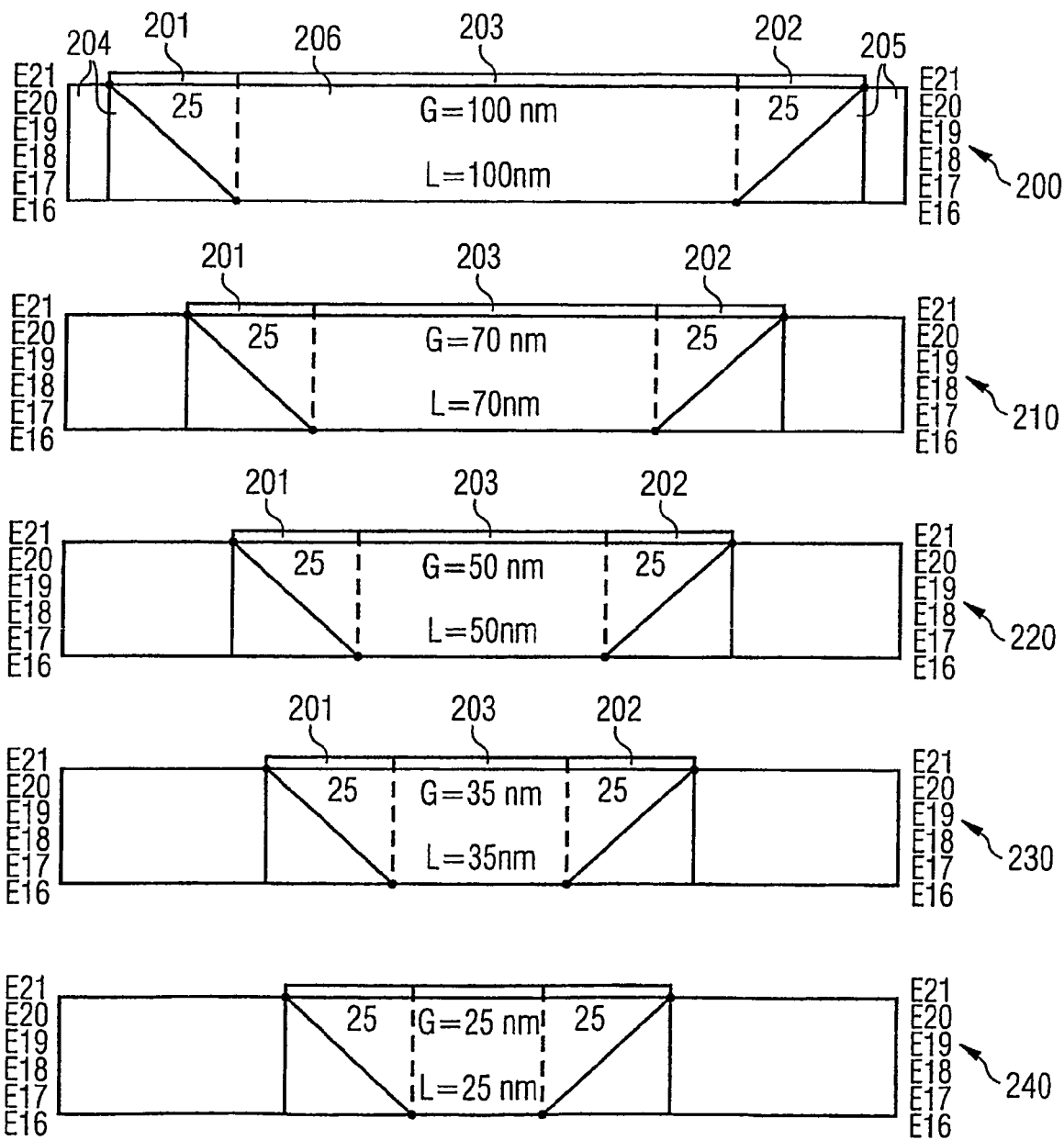

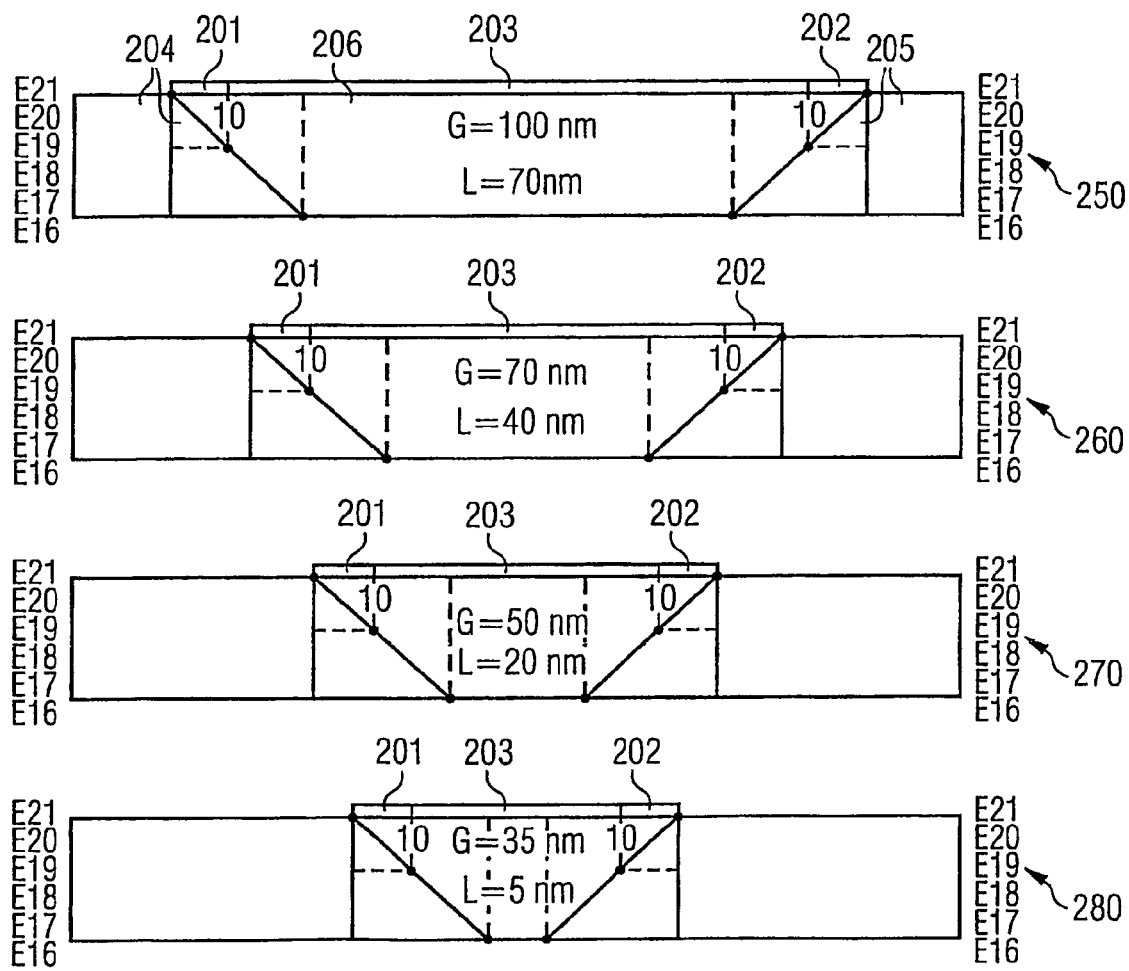

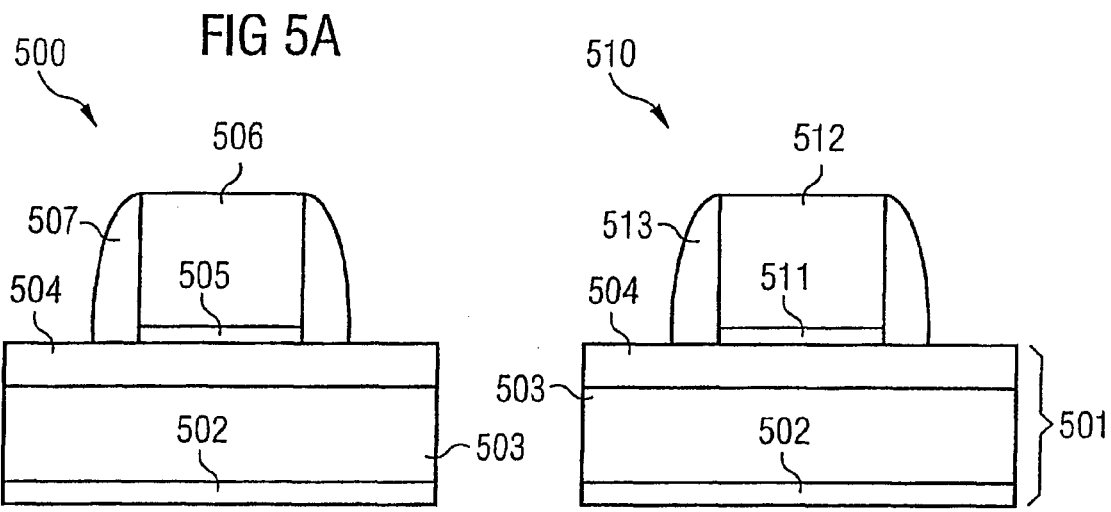
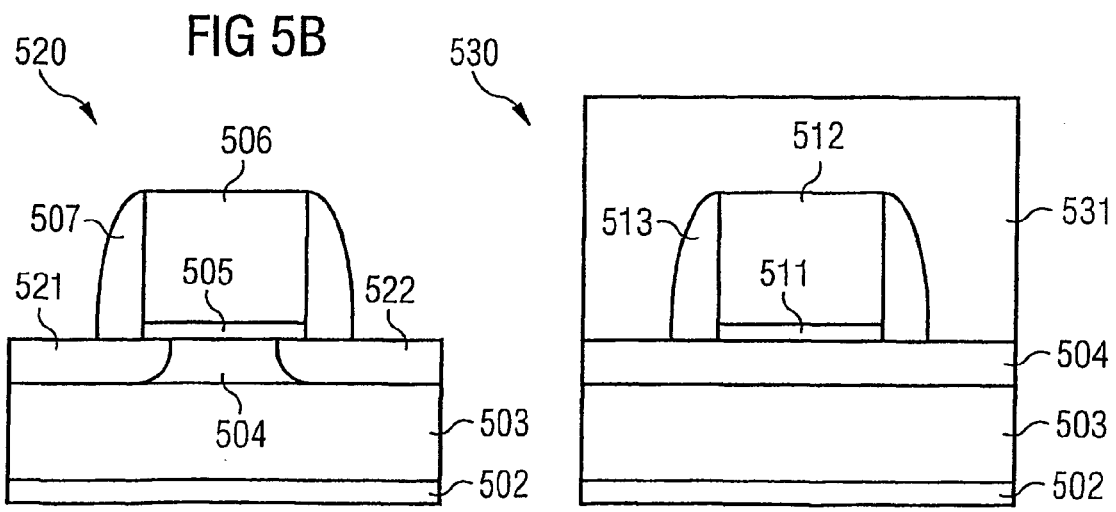

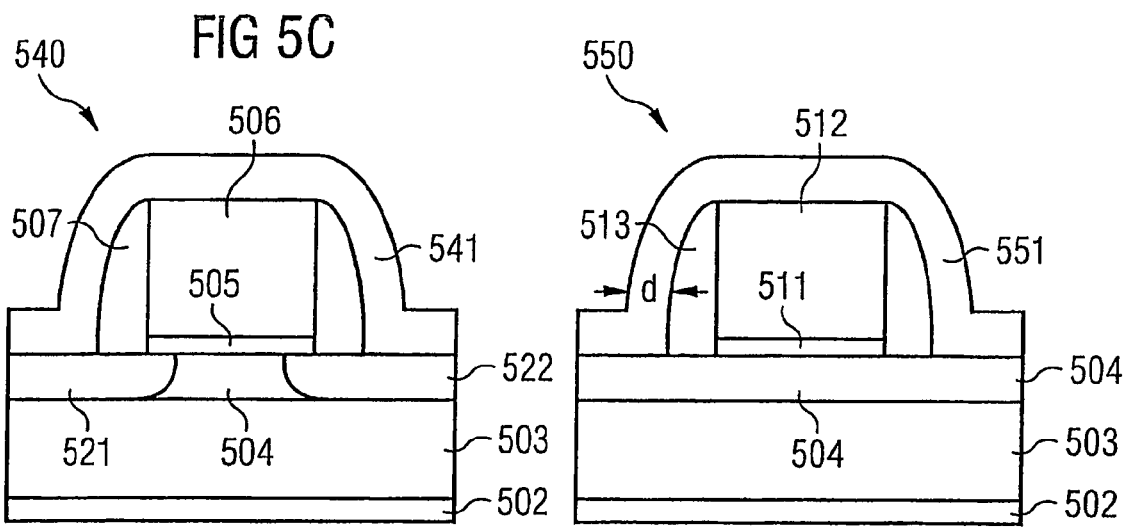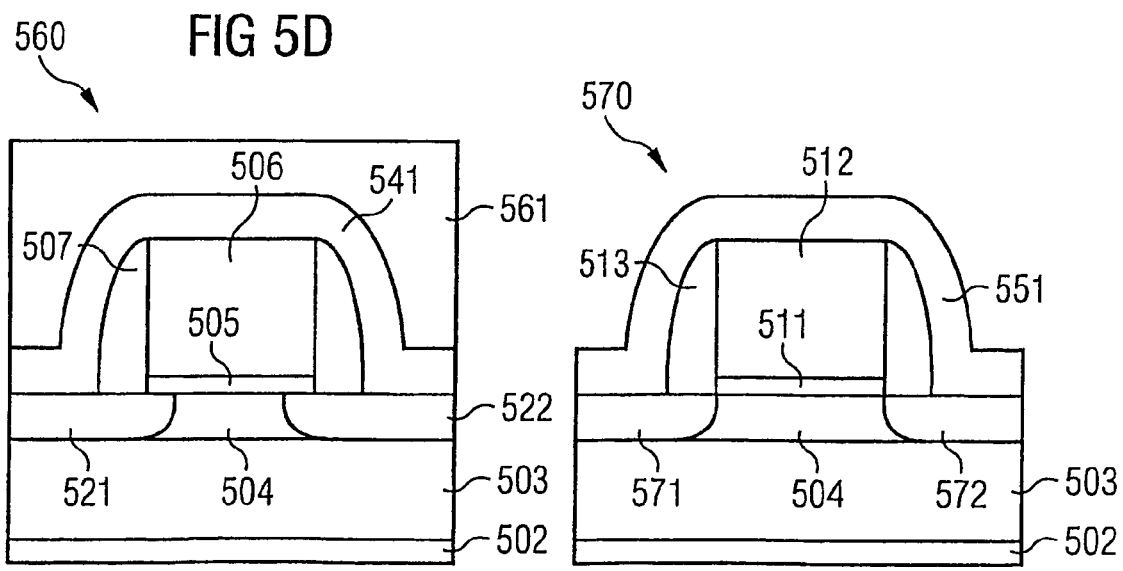

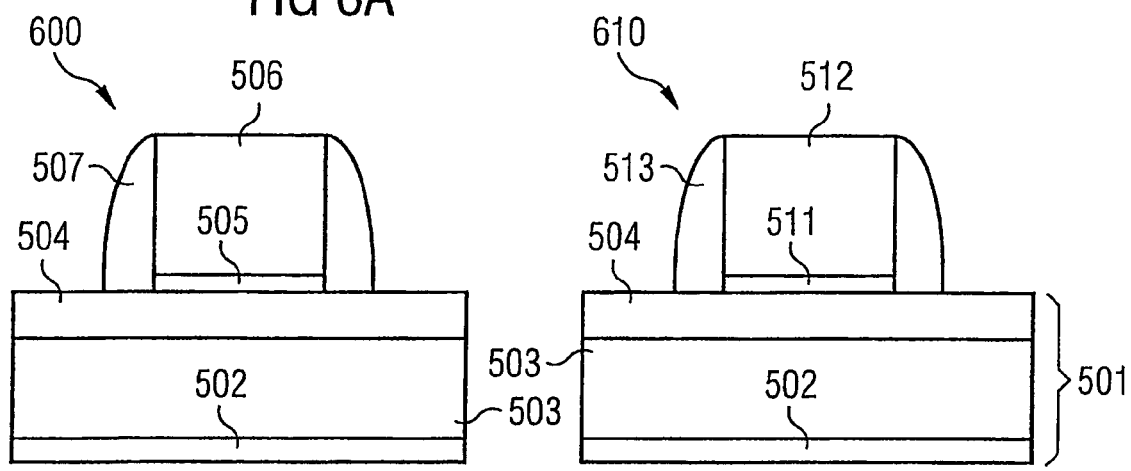
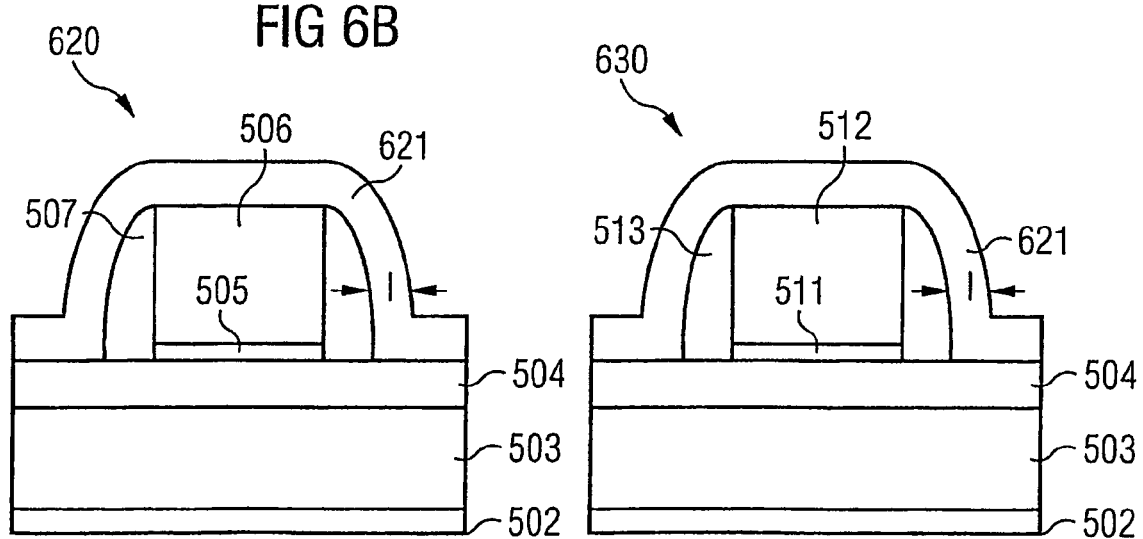

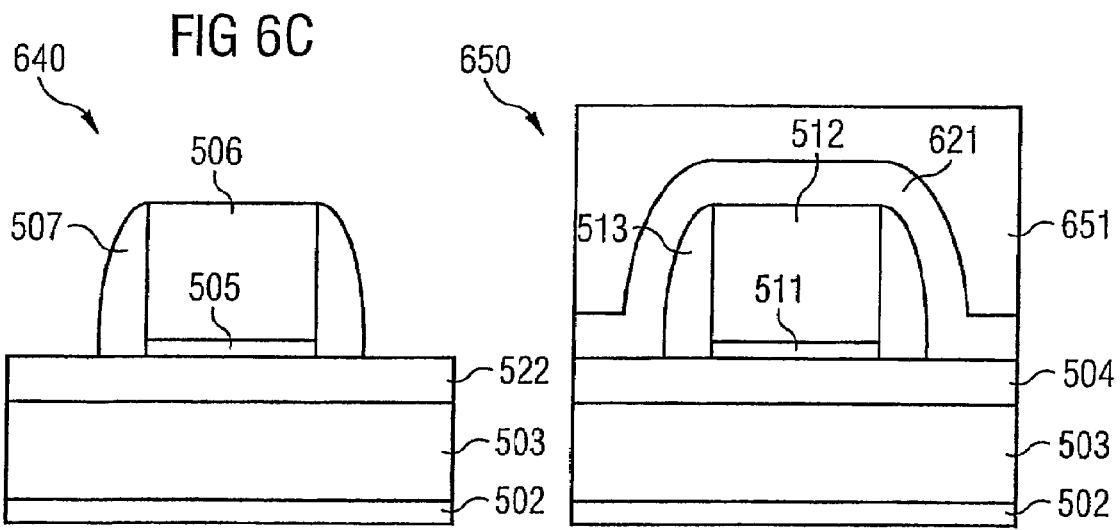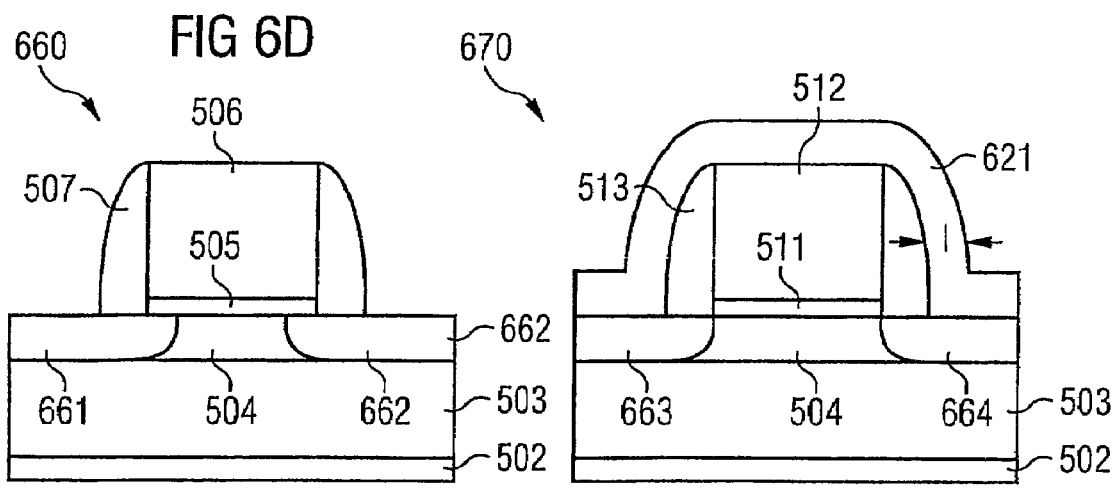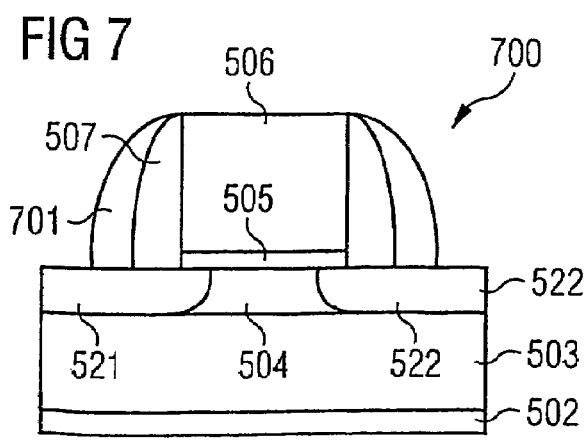

METHOD FOR PRODUCING AN SOI FIELD EFFECT TRANSISTOR

CROSS-REFERENCE TO RELATED APPLICATION

This application is a continuation of International Patent Application Serial No. PCT/DE03/00933, filed Mar. 20, 2003, which published in German on Oct. 2, 2003 as WO 03/081675.

FIELD OF THE INVENTION

The invention relates to a method for producing an SOI field effect transistor and to an SOI field effect transistor.

BACKGROUND OF THE INVENTION

Field effect transistors are required for many applications in silicon microelectronics.

In circuit technology, it is often desirable, in modern CMOS processes, to have a plurality of different n-MOS transistors and a plurality of different p-MOS transistors having different threshold voltages (so-called multi-$V_T$ technology, where $V_T$ denotes the threshold voltage of the transistor). For specific applications, it may be necessary to have transistors with a particularly high switching speed, whereas a minimal leakage current of the transistor is sought in other applications. If the multi-$V_T$ technology is combined with the use of different supply voltages $V_{DD}$ of an integrated circuit (multi-$V_{DD}$/$V_T$ technology), then the optimum voltage swing may be selected, depending on the switching activity of a specific transistor of an integrated circuit, in order to achieve maximum boosting of the gate voltage $V_{DD}$-$V_T$. Examples of transistors having such requirements are transistors in clock circuits with high switching activity, a low voltage swing and a low threshold voltage. In the case of a transistor in a clock circuit, the leakage current is of relatively little relevance on account of the high activity, whereas minimizing the dynamic power loss (which is a function of the square of the supply voltage $V_{DD}$) is of primary interest. By contrast, in logic circuits with relatively low activity (for example less than 30%), the static power loss on account of electrical leakage currents in the switched-off state is of greater relevance, so that transistors having a higher threshold voltage are advantageous here. In order not to impair the switching speed in the active state (the switching time $t_D$ is proportional to $1/[V_{DD}-V_T]$) and in order to avoid an undesirable reduction of the boosting of the gate voltage, the supply voltage $V_{DD}$ of the logic block is increased correspondingly.

An overview of the multi-$V_{DD}$/$V_T$ circuit technology, in particular with regard to conventional CMOS technology, is found for example in Hamada, M, Ootaguro, Y, Kuroda, T (2001) "Utilizing Surplus Timing for Power Reduction", Proceedings of the IEEE Custom Integrated Circuits Conference 2001.

A central problem of conventional integrated circuits is the increasing deterioration of the electrical properties of MOS transistors ("metal oxide semiconductor") with increasing structural fineness, that is to say miniaturization. This is caused for example by the punch-through effect, the latch-up effect and also the parasitic capacitance between the drain/source region and the substrate, the parasitic capacitance greatly increasing more than proportionally in relation to the transistor size. The term punch-through effect refers to an undesirable punch-through of current between adjacent transistors of a transistor arrangement. The term latch-up effect designates the phenomenon wherein a transistor of the p conduction type and a transistor of the n conduction type, when the distance between them falls below a minimum distance, may form a parasitic thyristor at which a high triggering current may flow, which may effect a local destruction of an integrated semiconductor component.

The problems described are alleviated in the case of SOI technology ("silicon-on-insulator"), which uses a silicon layer on a silicon oxide layer on a silicon substrate as basic material for forming an integrated circuit. The problems described can be alleviated particularly with the use of a thin layer of silicon (e.g. having a thickness of 20 nm) on an electrically insulating silicon oxide layer.

Furthermore, using a doped substrate may give rise to the problem that technologically dictated local fluctuations in the dopant concentrations give rise to a variation of the threshold voltage in different transistors of an integrated circuit. This problem is avoided when an undoped substrate is used.

However, if a thin undoped silicon layer is used as a base layer for forming a field effect transistor, then it is not possible to alter the threshold voltage of the field effect transistor by setting the doping of the channel region. In this case, the threshold voltage of a field effect transistor may be defined by defining the work function of the material of the gate region. In this case, a separate gate material is in each case required for each type of transistor (low-power transistor or high-performance transistor, p-MOS transistor or n-MOS transistor), the threshold voltage of the respective transistor being defined by selection of the gate material.

However, the free material selection of the gate regions of different transistors of an integrated circuit may be restricted for technological reasons. Furthermore, it is complicated and therefore expensive to use different gate materials in a method for producing an integrated circuit with different transistors.

Thin-film SOI transistors ("silicon-on-insulator") are of interest particularly in the case of a CMOS technology with dimensions below 50 nm. As discussed for example in Schiml, T, Biesemans, S, Brase, G, Burrell, L, Cowley, A, Chen, KC, Ehrenwall, A, Ehrenwall, B, Felsner, P, Gill, J, Grellner, F, Guarin, F, Han, LK, Hoinkis, M, Hsiung, E, Kaltalioglu, E, Kim, P, Knoblinger, G, Kulkarni, S, Leslie, A, Mono, T, Schafbauer, T, Schroeder, P, Schruefer, K, Spooner, T, Towler, F, Warner, D, Wang, C, Wong, R, Demm, E, Leung, P, Stetter, M, Wann, C, Chen, JK, Crabbe, E (2001) "A 0.13 µm CMOS Platform with Cu/Low-k Interconnects for System On Chip Applications" 2001 Symposium on VLSI Technology, Digest of Technical Papers, in view of the high diversity of components, a plurality of different types of transistor are required for the logic in existing processes of the 130 nm technology. In the case of three different types of transistor with different threshold voltages (high threshold voltage, medium threshold voltage, low threshold voltage) and also in the case of two different types of charge carrier (n-MOS transistor, p-MOS transistor) a total of six different materials result for the gate region. An associated thin-film SOI-CMOS process therefore requires a very high process complexity.

In present-day CMOS technologies, the threshold voltage of the field effect transistors used therein is generally set by doping the channel region. Such implantations include forming LDD regions ("Lightly Doped Drain"), carrying out a pocket doping (localized doping of the region between the source/drain regions or in the channel region, thereby reducing the sensitivity of the transistor to technologically dictated fluctuations in the length of the gate region), and also forming a retrograde well (clearly a highly doped region within the substrate between the source/drain regions). However, these implantations are subject to technologically dictated fluctuations, which result in undesirable fluctuations of the transistor properties. Furthermore, particularly in the case of fully depleted thin-film SOI transistors primarily in the case of technology nodes with feature dimensions of less than 50 nm, it is no longer possible to employ this method for setting the threshold voltage since the doping-dependent contribution to the threshold voltage $V_T^{dop}$ is proportional to $q*N_A*t_{si}$. In this case, $t_{si}$ designates the thickness of the silicon layer, $N_A$ designates the dopant concentration in the channel region, and q designates the electrical elementary charge. For $t_{si}<20$ nm and $N_A<10^{16}$ cm$^{-3}$, $V_T^{dop}$ then has hardly any influence on the threshold voltage.

The alternative to setting the threshold voltage by means of targeted doping consists in using a plurality of different gate materials for transistors with different threshold voltages and also different conduction types. However, thin-film SOI-CMOS processes that permit the formation of MOS transistors with different threshold voltages do not exist at the present time.

One possibility for setting the transistor properties in SOI technology is the use of transistors having different lengths of the gate region, since the length of the gate region also has a crucial influence on the threshold voltage of a field effect transistor. A capability for sufficiently exact setting of the threshold voltage of transistors by setting the length of the gate region presupposes a sufficiently good resolution of a masking technique.

FIG. 1A shows an SOI field effect transistor 100 in a technology with a minimum feature dimension that can be achieved of F=150 nm. The SOI transistor 100 has a silicon substrate 101, a silicon dioxide layer 102 arranged on the silicon substrate 101, and an undoped silicon layer 103 arranged on the silicon dioxide layer 102. The layers 101 to 103 form an SOI layer. A first source/drain region 106 is implanted in a first surface region of the undoped silicon layer 103, and a second source/drain region 107 is implanted in a second surface region of the undoped silicon layer 103. A region between the two source/drain regions 106, 107 of the undoped silicon layer 103 forms the channel region 108. In FIG. 1A, the lateral extent of the gate region 104 is determined by the smallest feature dimension that can be achieved in the technology generation, F=150 nm. A typical value for the inaccuracy during patterning is designated by AF in FIG. 1A. An accuracy of approximately ΔF=±20 nm can be achieved with the best patterning methods existing at the present time (electron beam lithography).

FIG. 1B shows a field effect transistor 110 of a technology generation in which the minimum feature dimension that can be achieved is F=50 nm. Assuming that the best resolution achieved at the present time is ΔF=20 nm, then it can be discerned that with conventional masking techniques, when striving for technology generations of 50 nm or less the uncertainties in the accuracy of the mask are too large to set the length of the gate region or the length of the channel region with sufficient accuracy. The relative accuracy when setting the length of the gate region in a technology generation where F=50 nm and with an uncertainty of ΔF=20 nm is 40%.

Therefore, as feature dimensions decrease further, with conventional masking technology, the threshold voltage of a transistor cannot be set with satisfactory accuracy by setting the length of the gate region. Moreover, the costs are very high when using masks. Furthermore, the production time of transistors increases more and more as masks become finer.

U.S. Pat. No. 5,532,175 discloses a method for adjusting a threshold voltage for a semiconductor device on an SOI substrate, in which a threshold voltage adjusting implantation is carried out.

Nuernbergk, D M et al. (1999) "Mache mögen's heiß—Silicon on Insulator Bauelemente und ihre Besonderheiten", in: "Mikroelektronik und Fertigung", pages 61 to 64, discloses an overview of silicon-on-insulator components and their particular properties.

DE 198 23 212 A1 discloses a semiconductor device in which a field-shielding gate oxide layer is thicker at an edge section of a field-shielding gate electrode below a sidewall oxide layer.

DE 198 57 059 A1 discloses an SOI component and a method for producing it, in which the effect of a body at floating potential is reduced.

U.S. Pat. No. 5,273,915 discloses a method for producing bipolar junctions and MOS transistors on SOI.

SUMMARY OF THE INVENTION

The invention is based on the problem of providing a possibility for adjusting a transistor property of an SOI field effect transistor with sufficient accuracy and with a tenable outlay.

The problem is solved by means of a method for producing an SOI field effect transistor with predeterminable transistor properties and by means of an SOI field effect transistor with predeterminable transistor properties having the features in accordance with the independent patent claims.

In accordance with the method according to the invention for producing an SOI field effect transistor with predeterminable transistor properties, a laterally delimited layer sequence with a gate-insulating layer and a gate region is formed on a substrate. Furthermore, a spacer layer having a predetermined thickness is formed at least on a part of the sidewalls of the laterally delimited layer sequence. Moreover, two source/drain regions having a predetermined dopant concentration profile are formed by introducing dopant into two surface regions of the substrate which are adjoined by the spacer layer, the layer sequence and the spacer layer being set up in such a way that they form a shadowing structure for preventing dopant from being introduced into a surface region of the substrate between the two source/drain regions. The transistor properties of the SOI field effect transistor are set by setting the thickness of the spacer layer and by setting the dopant concentration profile.

The SOI field effect transistor according to the invention with predeterminable transistor properties has a laterally delimited layer sequence with a gate-insulating layer and a gate region on a substrate. Furthermore, the SOI field effect transistor has a spacer layer having a predeterminable thickness on at least a part of the sidewalls of the laterally delimited layer sequence, and also two source/drain regions in two surface regions of the substrate which are adjoined by the spacer layer, with a predeterminable dopant concentration profile. The layer sequence and the spacer layer are set up in such a way that they form a shadowing structure for preventing dopant from being introduced in a surface region of the substrate between the two source/drain regions during the production of the SOI field effect transistor. The transistor properties of the SOI field effect transistor are set by setting the thickness of the spacer layer and by setting the dopant concentration profile.

One basic idea of the invention consists in predetermining a transistor property (e.g. the threshold voltage) of an SOI field effect transistor by setting the thickness of a sidewall spacer layer and by adjusting the dopant concentration profile of the source/drain regions. The invention makes it possible to define the length of the gate region by means of a deposition method with an accuracy in the angstrom range. Problems known from the prior art (e.g. fluctuations in the dopant concentration in the substrate, complicated use of a multiplicity of different gate materials, etc.) are avoided.

The invention makes it possible to form a circuit arrangement on an SOI substrate in which it is possible to form different transistors with different transistor properties (e.g. different threshold voltages for high-performance or low-power applications) by applying a spacer layer on a laterally delimited layer sequence comprising gate region and gate-insulating layer. During a subsequent doping, the arrangement comprising laterally delimited layer sequence and spacer layer functions as a shadowing structure and prevents doping of the region between the source/drain regions. Since the length of the channel region depends directly on the thickness of the spacer layer, an exact setting of transistor properties which are correlated with these geometrical properties is made possible.

In particular it should be noted that when using a deposition method (e.g. atomic layer deposition) for forming the spacer layer, the thickness thereof can be set with an accuracy of a few angstroms, whereas the accuracy of a masking technique is of the order of magnitude of 20 nm. A significantly improved capability of setting the gate length is thereby realized according to the invention. The range of the underdiffusion of dopant into the undoped channel region can be controlled by setting the thickness of the spacer layer and the parameters during doping (type of dopant, selection and setting of the parameters of the doping method).

The deposition of a spacer is more cost-effective than the use of fine masks.

The method according to the invention avoids the use of more than two different materials (p-type, n-type) for the gate regions. For any desired thickness of a spacer layer, only one additional mask is required in order to produce a field effect transistor with a predetermined threshold voltage. When using a depleted, that is to say undoped silicon layer into which the transistor is integrated, complicated implantations in the channel region (LDD regions, pocket doping, retrograde well) are dispensable.

Preferred developments of the invention emerge from the dependent claims.

The predetermined transistor property may be the length of the channel region between the two source/drain regions, the threshold voltage, the leakage current characteristic, the maximum current or a transistor characteristic curve. According to the invention, the transistor property may be set by setting the dopant concentration profile or by setting the thickness of the spacer layer.

The thickness of the spacer layer may be set by forming the spacer layer using a chemical vapor deposition method (CVD method) or an atomic layer deposition method (ALD method). In the case of the ALD method, in particular, it is possible to precisely set a thickness of a layer to be deposited down to an accuracy of one atomic layer, that is to say down to an accuracy of a few angstroms. The high accuracy when setting the thickness of the spacer layer effects a high accuracy when setting the transistor property.

The two source/drain regions are preferably formed using an ion implantation method or a diffusion method, the dopant concentration profile being set by selecting the type, the concentration and/or the diffusion properties of the dopants.

An undoped substrate is preferably used, thereby avoiding the problems arising in conventional CMOS technologies on account of a statistically fluctuating dopant concentration. A complicated doping method is also avoided. A substrate may also be regarded as (essentially) undoped when it has a dopant concentration that is considerably lower than a dopant concentration of typically $10^{19}$ cm$^{-3}$ used in the conventional CMOS technology.

The transistor properties of the SOI field effect transistor may alternatively be set by selecting the material of the gate region, the dopant concentration of the substrate and/or the dopant profile of the substrate. As a result, further parameters are available by means of which the transistor properties can be set.

In particular, the dopant profile of the substrate may be set using a pocket doping and/or retrograde well.

Furthermore, a second SOI field effect transistor may be formed in accordance with the method according to the invention for producing the SOI field effect transistor on and/or in the substrate, the transistor properties of the second SOI field effect transistor being set differently from those of the SOI field effect transistor. Such a need may arise e.g. in a semiconductor memory, since the requirements made of transistors in the logic region of a memory and in the memory region of a memory differ greatly.

The different transistor properties of the SOI field effect transistor and of the second SOI field effect transistor preferably result solely from a different thickness of the spacer layer. In other words, in particular the same gate material may be used for the transistors with different transistor properties, which results in a considerably simplified processing.

Furthermore, a third SOI field effect transistor can be formed in accordance with the method for producing the SOI field effect transistor in and/or on the substrate, the transistor properties of the third SOI field effect transistor being set analogously to those of the SOI field effect transistor. The conduction types of the SOI field effect transistor and the third SOI field effect transistor are complementary to one another. In other words, both a p-MOS transistor and an n-MOS transistor may be formed according to the invention. This takes account of the requirements of silicon microelectronics to have transistors of both conduction types on an integrated circuit.

The gate regions of the SOI field effect transistor and of the second SOI field effect transistor or of the SOI field effect transistor, of the second SOI field effect transistor and of the third SOI field effect transistor may be produced from the same material. This simplifies the process implementation and reduces the costs.

The material of the gate regions preferably has a value of the work function which is essentially equal to the arithmetic mean of the values of the work function of heavily p-doped polysilicon (p$^+$-type polysilicon) and heavily n-doped polysilicon (n$^+$-type polysilicon). This is referred to as a so-called "mid-gap" gate. n$^+$-polysilicon has a work function of approximately 4.15 eV (electron volts), and p$^+$-type polysilicon has a work function of approximately 5.27 eV. Therefore, a gate material with a band gap between the two values mentioned is suitable both for an n-type field effect transistor and for a p-type field effect transistor, for example tungsten, tantalum, titanium nitride or p$^+$-doped germanium.

The material of the gate region furthermore preferably has a work function of between 4.45 eV and 4.95 eV.

Preferably, the transistor properties of the SOI field effect transistor and of the second SOI field effect transistor are set in such a way that one of the two SOI field effect transistors is optimized for a low leakage current and the other for a low threshold voltage. This advantageously enables a transistor in a clock circuit to be optimized for a high switching speed and therefore for a low threshold voltage. By contrast, a transistor in a memory region may be set up in a simple manner such that it permanently maintains a stored item of information and therefore has a lower leakage current.

Furthermore, in accordance with the method according to the invention, at least one SOI field effect transistor may be formed as a vertical transistor, as a transistor having at least two gate terminals (double gate transistor) or as a fin-FET (fin field effect transistor). The principle according to the invention can fundamentally be applied to all types of transistors.

Furthermore, in accordance with the method according to the invention, the second SOI field effect transistor may be protected from doping during the formation of the source/drain regions of the SOI field effect transistor by means of a protective layer. Alternatively or supplementary, the SOI field effect transistor may be protected from doping during the formation of the source/drain regions of the second SOI field effect transistor by means of a protective layer.

At least one of the SOI field effect transistors may have at least one additional spacer layer on the spacer layer. In other words, it is possible to form a plurality of spacer layers one on top of the other, the properties of the associated transistor essentially being defined by the total thickness of the plurality of spacer layers formed one on top of the other.

The method according to the invention can be applied both to lateral thin-film SOI transistors with one gate terminal and to double gate MOSFETS, planar transistors, vertical transistors or transistors of the fin-FET type.

Furthermore, the method can be applied without any problems to a technology with different thicknesses of gate-insulating layers. In this case, the diversity of components is extended by transistors with gate-insulating layers of different thicknesses (thickness $t_{ox}$) (so-called multi-$V_{DD}$/$V_T$/$t_{ox}$ technology).

According to the invention, the thickness of the spacer layer is varied in the case of a predetermined source/drain doping (it is possible to predetermine the doping method, the dopant concentration, the dopant, etc.) and a fixed metallurgical length of the gate region. Assuming a source/drain doping profile with a spatial decrease $\Delta N/\Delta y$ in the dopant concentration N as a function of the doping location y of 5 nm per decade (logarithmic), then the effective length of the channel region, which, in the SOI field effect transistor with an undoped silicon substrate, depends on the length of the undoped silicon region, can be set by setting the length of the source/drain doping tails. In the case of a thin spacer layer, the source/drain doping tails project correspondingly far into the channel region, thereby shortening the effective channel length. This results in different electrical properties of the transistors, since the subthreshold voltage and also other short channel effects, such as the gate induced drain leakage (GIDL) that dominates the leakage current (off current), are influenced. Therefore, with the metallurgical gate length unchanged, a transistor having a thicker spacer has a higher threshold voltage and a lower leakage current (off current) and a lower maximum current (on current) than a transistor having a thinner spacer.

An essential idea of the invention consists in the simplified setting and optimization of transistor parameters by precisely defining a lateral spacer layer with respect to the gate region independently of the quality of an optical mask. The setting of the doping properties also has a crucial influence on the threshold voltage.

It should be noted that refinements of the method for forming an SOI field effect transistor with predeterminable transistor properties also apply to the SOI field effect transistor according to the invention.

BRIEF DESCRIPTION OF THE DRAWINGS

Exemplary embodiments of the invention are illustrated in the figures and are explained in more detail below.

FIG. 2A shows a schematic view showing the relationship between gate length; channel length, thickness of a spacer layer and dopant profile of a field effect transistor for a low-power application;

FIG. 2B shows a schematic view showing the relationship between gate length, channel length, thickness of a spacer layer and dopant profile of a field effect transistor for a high-performance application;

FIGS. 5A to 5D show layer sequences at different points in time during a method for producing an SOI field effect transistor with predeterminable transistor properties in accordance with a first exemplary embodiment of the invention;

FIGS. 6A to 6D show layer sequences at different points in time during a method for producing an SOI field effect transistor with predeterminable transistor properties in accordance with a second exemplary embodiment of the invention;

FIG. 7 shows a layer sequence in accordance with an alternative to the formation of spacer layers in accordance with the invention;

DETAILED DESCRIPTION OF PREFERRED EMBODIMENTS OF THE INVENTION

Figure 1A:
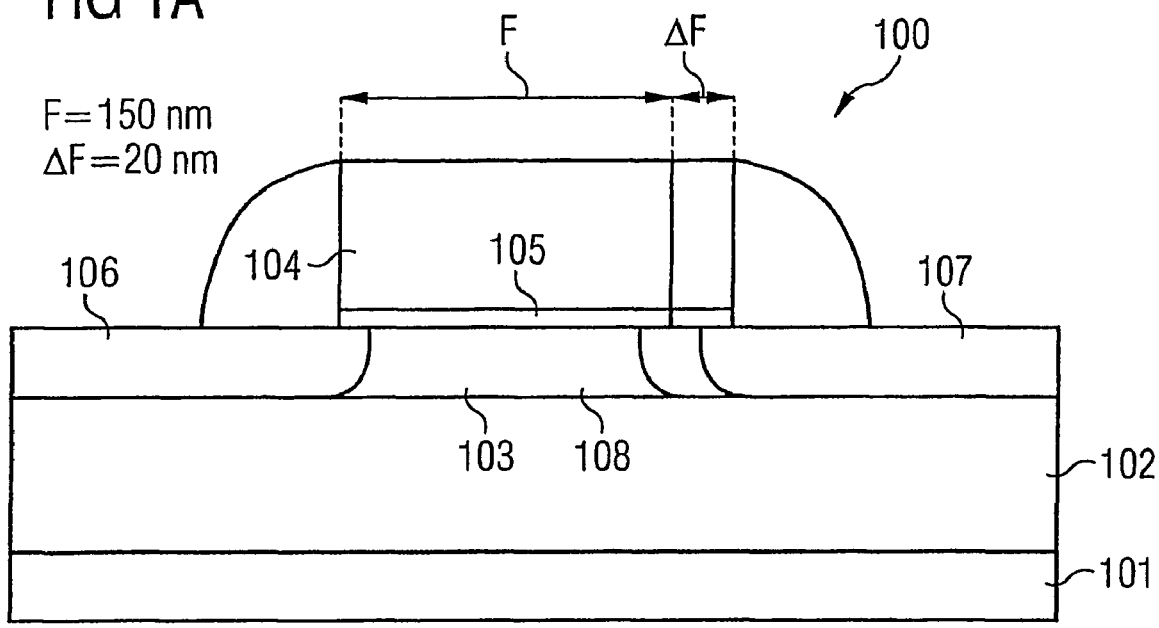
FIG. 1A shows one field effect transistor in accordance with the prior art whose transistor properties are defined by setting a mask.
Figure 1B:
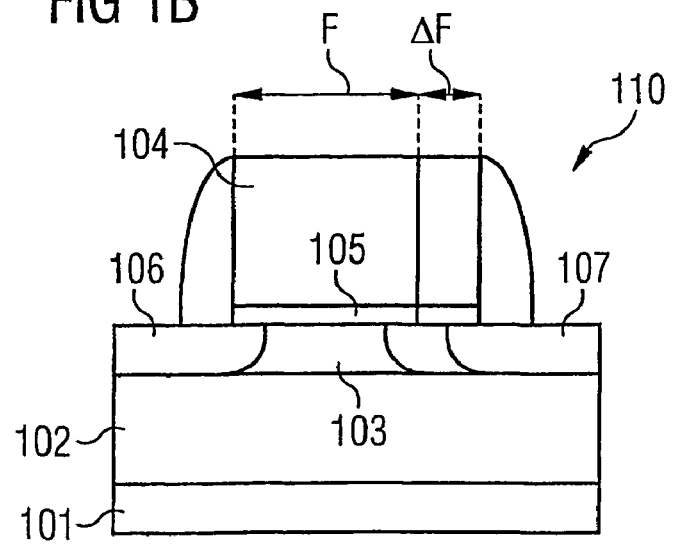
FIG. 1B shows another field effect transistor in accordance with the prior art whose transistor properties are defined by setting a mask.

Components that are contained identically in different exemplary embodiments are provided with the same reference numerals below.

A description is given below, referring to FIGS. 2A and 2B, of the relationship between the length of the channel region of a field effect transistor, the length of the gate region or of the gate-insulating layer, the thickness of a spacer layer and also the dopant concentration profile.

FIG. 2A, shows, for a field effect transistor for low-power applications (large threshold voltage, small leakage current), an arrangement of layer components along the horizontal axis, whereas the spatial dependence of the dopant concentration is shown along the vertical axis in a logarithmic representation. It is assumed that, in a surface region of a silicon layer into which the source/drain regions of the field effect transistor are implanted, the dopant concentration falls exponentially proceeding from the outer side of the spacer layer into the channel region. In this case, it is assumed that, from the outside inward, the dopant concentration decreases continuously by a power of ten at intervals of 5 nm in each case. Under this premise, a spacer layer having a thickness of 25 nm is required to produce a fall in the dopant concentration of the source/drain region from $10^{21}$ cm$^{-3}$ to a concentration of $10^{16}$ cm$^{-3}$ (this corresponds to an approximately undoped substrate).

FIG. 2A shows the spacer layers 201, 202 at the left-hand and right-hand side edge, respectively, of the gate region 203. The two spacer layers 201, 202 have a thickness of 25 nm in each case. The gate region has a width G=100 nm in the topmost illustration of FIG. 2A. Owing to the set spatial dependence of the dopant concentration, the length of the channel region L=100 nm is equal to the length of the gate region G=100 nm. The first source/drain region 204 and the second source/drain region 205 are in each case formed from those regions of the silicon layer 206 which lie below the associated spacer layer 201, 202, and also by the region having a high dopant concentration that is respectively arranged on the left and right thereof.

As shown in FIG. 2A, the first source/drain region 204 and the second source/drain region 205 in each case have two partial sections. In this case, the respective outer section corresponds to a region of the substrate 206 which is free of a covering with one of the spacer layers 201 and 202, respectively, and has an essentially homogeneous dopant concentration. By contrast, the first and second source/drain partial region covered by one of the spacer layers 201 and 202, respectively, has a highly spatially dependent (exponentially spatially dependent in accordance with the schematic illustration of FIG. 2A) dopant concentration.

As shown in the diagrams 210, 220, 230, 240, a smaller length of the channel region L can also be achieved by selecting a correspondingly smaller length of the gate region G. However, the length of the channel region L is also dependent on the thickness of the spacer layers 201, 202 and also on the spatial decrease in the dopant concentration (here by one decade every 5 nm). Therefore, a low-power field effect transistor with a desired length of the channel region and a correspondingly high value of the threshold voltage can be formed in particular by selecting the dopant concentration and also the thickness of the spacer layers 201, 202. In other words, with a spacer layer having a thickness of 25 nm, in the case of a fall in the dopant concentration of 5 nm per decade, it is possible to achieve a field effect transistor for low-power applications in which the length of the gate region corresponds to the length of the channel region.

By contrast, in the case of the transistor for high-performance applications that is shown schematically in FIG. 2B, it is advantageous that the length of the channel region is short enough to achieve a small threshold voltage and therefore a short switching time. The thicknesses of the spacer layers 201, 202 are chosen in each case with a thickness of 10 nm in the diagrams 250, 260, 270, 280 from FIG. 2B. The same assumption as in FIG. 2A is made for the fall in the dopant concentration. As shown for example in diagram 250, on account of the underdiffusion at both edge regions of the gate region 203, the result is a region having a thickness of 15 nm below the gate region, in which a dopant concentration of more than $10^{16}$ cm$^{-3}$ is present. Therefore, in the cases of the diagrams 250, 260, 270, 280, the length of the channel region L is reduced by 2*15 nm=30 nm compared with the length of the gate region L. Therefore, given a predetermined length of the gate region, the length of the channel region can be set by choosing the width of the spacer layers 201, 202.

FIGS. 2A and 2B reveal, in particular, that the underdiffusion has an increasingly great effect on the transistor properties as gate lengths G decrease, so that a very sensitive possibility for influencing transistor properties is afforded particularly in future technology generations.

A description is given below, referring to FIG. 3A FIG. 3B, of characteristic curves of a field effect transistor for low-power applications with a gate length of 100 nm and a channel length of 100 nm. This corresponds to a configuration such as corresponds to the diagram 200 from FIG. 2A.

Figure 3A:
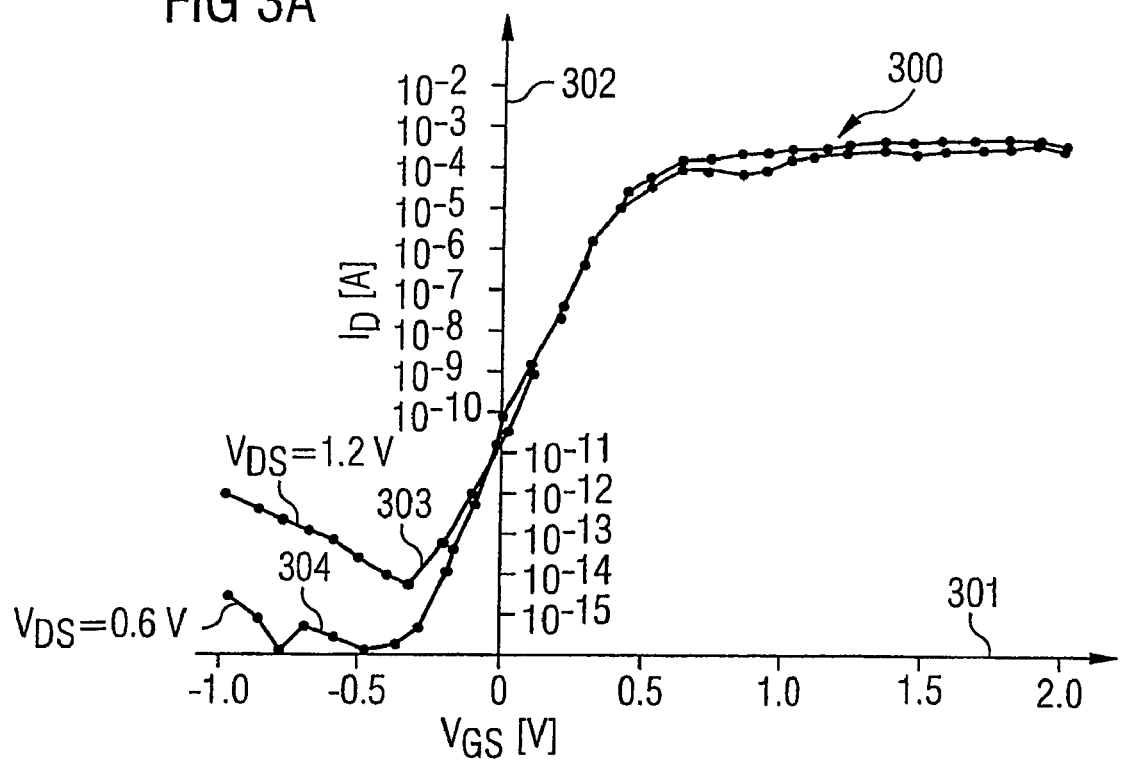
FIG. 3A shows a diagram showing input characteristic curves of a field effect transistor for low-power applications.

In diagram 300 from FIG. 3A, the electrical voltage between gate region and source region (first source/drain region) in volts is plotted along the abscissa 301. The electric current $I_D$ in amperes at the drain region (second source/drain region) is plotted in a logarithmic representation along the ordinate 302. FIG. 3A depicts a first curve 303, corresponding to a voltage $V_{DS}$ between the two source/drain regions of 1.2 V. Furthermore, the curve 304 corresponds to a voltage $V_{DS}$=0.6 V. It should be noted that both curves 303, 304 depicted are merely by way of example; it is possible to apply any other voltage between the source/drain regions. The curves depicted in FIG. 3A are referred to as input characteristic curves of the field effect transistor.

Figure 3B:
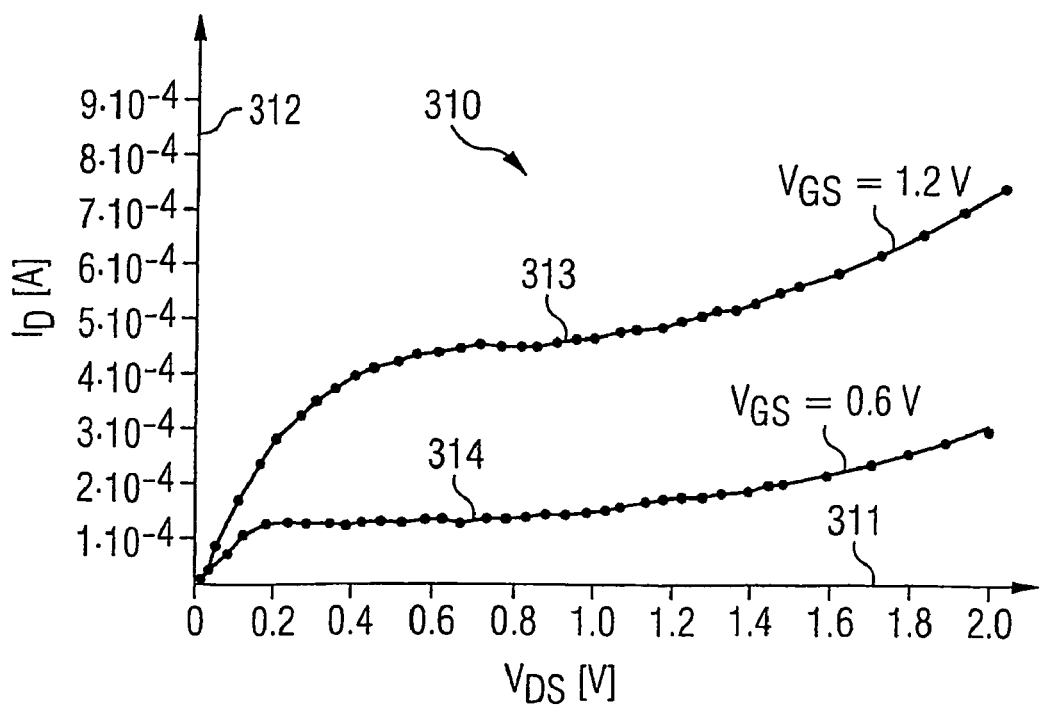
FIG. 3B shows a diagram showing output characteristic curves of a field effect transistor for low-power applications.

The third and fourth curves 313, 314 depicted in the diagram 310 from FIG. 3B are output characteristic curves of the field effect transistor for low-power applications with a gate length of 100 nm and a channel length of 100 nm. The electrical voltage between the two source/drain regions $V_{DS}$ in volts is plotted along the abscissa 311, whereas the electric current at one of the source/drain regions (drain region) $I_D$ in amperes is plotted along the ordinate 312 in FIG. 3B. The third curve 313 corresponds to a voltage between the first source/drain region (source region) and the gate region $V_{GS}$ of 1.2 V. By contrast, the fourth curve 314 corresponds to a voltage $V_{GS}$=0.6 V.

A description is given below, referring to FIG. 4A, of input characteristic curves and, referring to FIG. 4B, of output characteristic curves of a field effect transistor for high-performance applications with a gate length of 100 nm and a channel length of 70 nm.

Figure 4A:
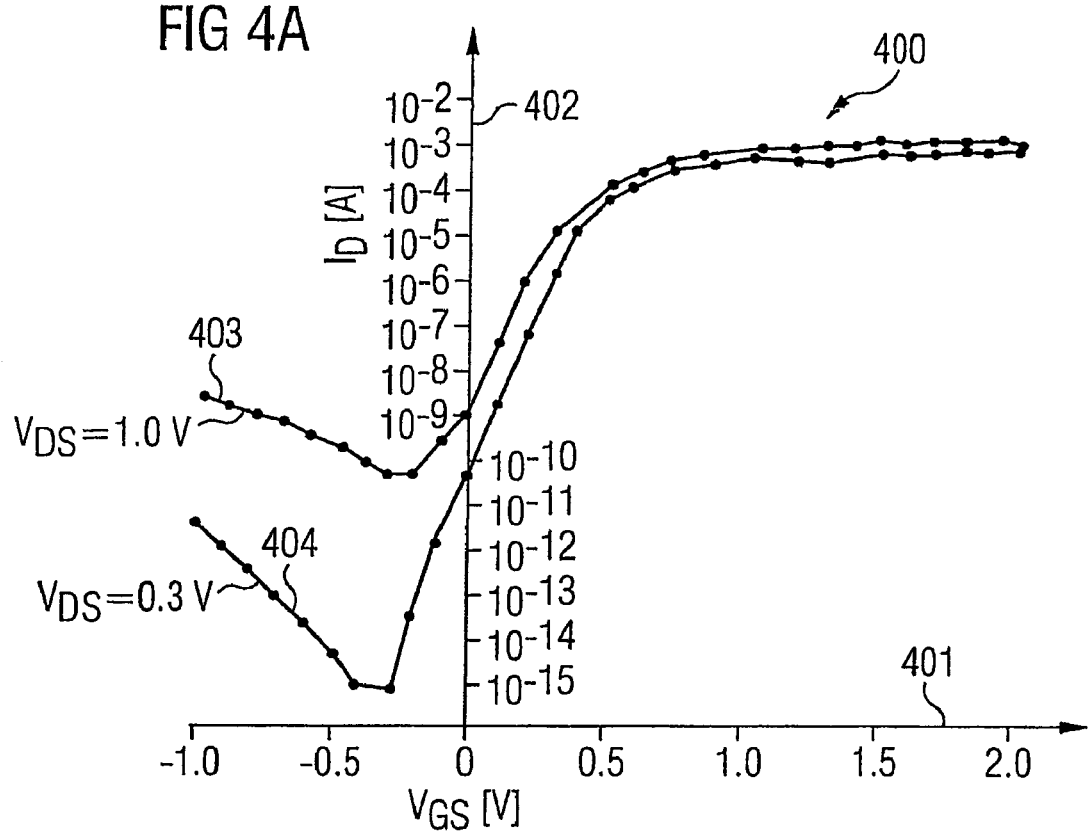
FIG. 4A shows a diagram showing input characteristic curves of a field effect transistor for high-performance applications.

Transistor characteristic curves for different electrical voltages between the two source/drain regions $V_{DS}$ are plotted in the diagram 400 from FIG. 4A. The voltage between the source region (first source/drain region) and the gate region in volts is plotted along the abscissa 401, whereas the electric current at one of the two source/drain regions (drain region) $I_D$ in amperes is plotted logarithmically along the ordinate 402 of the diagram 400. A first curve 403 corresponds to a voltage between the two source/drain regions $V_{DS}$=1.0 V, whereas a second curve 404 corresponds to a voltage $V_{DS}$=0.3 V.

Figure 4B:
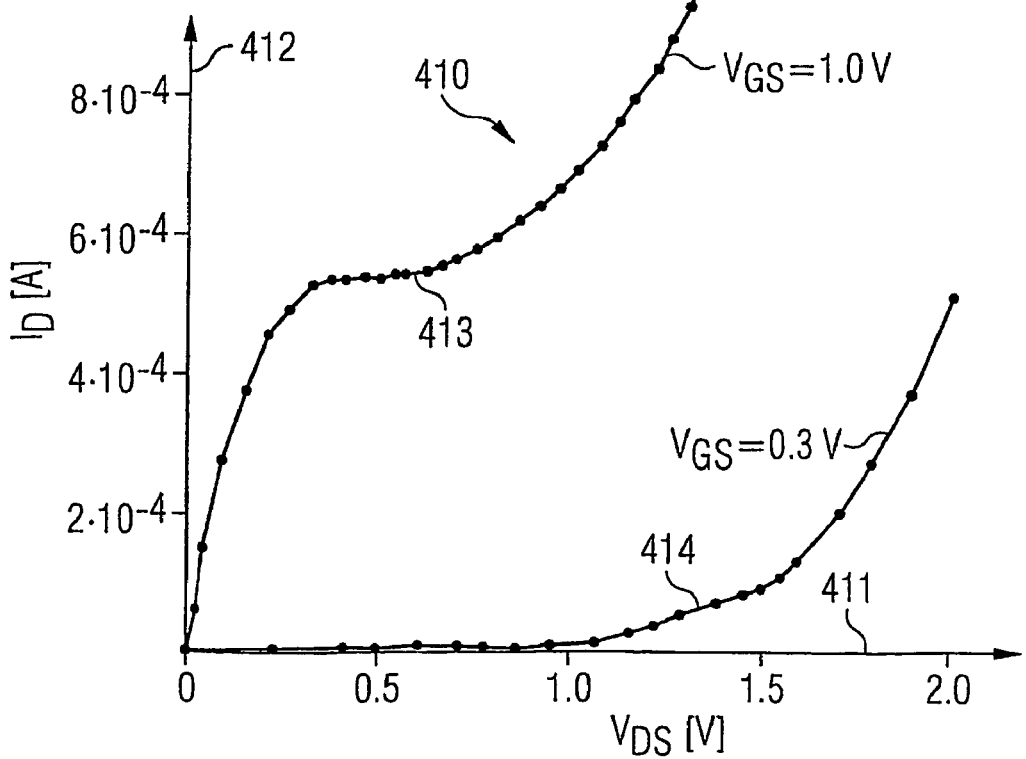
FIG. 4B shows a diagram showing output characteristic curves of a transistor for high-performance applications.

Output characteristic curves of the field effect transistor from FIG. 4A are plotted in FIG. 4B. The voltage between the two source/drain regions $V_{DS}$ in volts is plotted along the abscissa 411 of the diagram 410, whereas the current at one of the two source/drain regions $I_D$ in amperes is plotted along the ordinate 412. A third curve 413 shows a characteristic curve corresponding to a voltage between the gate region and the first source/drain region (source region) $V_{GS}$=0.1 V, whereas the fourth curve 414 corresponds to a voltage $V_{GS}$=0.3 V.

As shown by a comparison between FIG. 3A and FIG. 4A, and between FIG. 3B and FIG. 4B, the transistor characteristic curves can be set sensitively as transistor properties by applying spacer layers of different thicknesses. The input and output characteristic curves shown for the transistor with a gate length of 100 nm firstly as a low-power variant with a channel length of 100 nm (spacer having a thickness of 25 nm) and secondly as a high-performance variant with a channel length of 70 nm (spacer having a thickness of 10 nm) exhibits distinct differences. All other parameters of these transistors are identical.

The dopant concentration of the silicon layer 206 is in each case $10^{16}$ cm$^{-3}$, the thickness of the gate-insulating layer is 2 nm (silicon dioxide), the vertical thickness of the silicon layer 206 is 10 nm and the gate material is p$^+$-doped germanium.

A description is given below, referring to FIG. 5A to FIG. 5D, of a method for producing an SOI field effect transistor with predeterminable transistor properties in accordance with a first exemplary embodiment of the invention. FIG. 5A to FIG. 5D in each case show a field effect transistor for high-performance requirements with a low threshold voltage and high leakage current on the left-hand side and a transistor for low-power applications with a high threshold voltage and low leakage current on the right-hand side.

FIG. 5A shows layer sequences 500, 510 corresponding to a partly produced transistor in SOI technology. The layer sequences 500, 510 are processed on the same SOI substrate 501 comprising a silicon substrate 502, a silicon dioxide layer 503 and a silicon layer 504. A first laterally delimited layer sequence shown in the left-hand half of FIG. 5A is constructed from a first gate-insulating layer 505 and from a first gate region 506. Furthermore, a first TEOS protective layer 507 (tetraethyl orthosilicate) is applied on the sidewalls of the first laterally delimited layer sequence. The protective layer serves for electrically and mechanically decoupling the first laterally delimited layer sequence from the surroundings. A second laterally delimited layer sequence shown in the right-hand half of FIG. 5A is constructed from a second gate-insulating layer 511, a second gate region 512 and a second TEOS protective layer 513.

In order to obtain the layer sequences 520, 530 shown in FIG. 5B, the right-hand region in accordance with FIG. 5B is covered with a photoresist layer 531 in order subsequently to enable processing exclusively of the layer sequence shown on the left in FIG. 5B. In a further method step, doping atoms of the n conduction type are implanted into two surface regions of the silicon layer 504 using an ion implantation method in order to obtain two source/drain regions 521, 522 of the transistor with a low threshold voltage shown in the left-hand half of FIG. 5B. On account of the covering with photoresist 531, implantation ions are protected from penetrating into that surface region of the SOI substrate 501 which is illustrated in the right-hand half of FIG. 5B.

In order to obtain the layer sequences 540 and 550 shown in FIG. 5C, firstly the photoresist 531 is removed using a suitable etching method. In a further step, a spacer layer 541 and 551 having a predetermined thickness is in each case formed on the sidewalls of the first and second laterally delimited layer sequences, respectively, which is effected using the ALD method (atomic layer deposition). The ALD method makes it possible to predetermine the thickness of the spacer layer "d" down to an accuracy of one atomic layer, that is to say down to a few angstroms.

In order to obtain the layer sequences 560, 570 shown in FIG. 5D firstly a further photoresist layer 561 is deposited on the layer sequence 540 in order to shield the associated surface region of the SOI substrate from further processing. Afterward, in that surface region of the SOI layer sequence 501 which is free of the further photoresist layer 561, a third and a fourth source/drain region 571, 572 with a predetermined dopant concentration profile are formed by introducing dopant atoms of the n conduction type into two surface regions of the silicon layer 504 near the sidewalls of the second spacer layer 551. The second laterally delimited layer sequence and the second spacer layer 551 are set up in such a way that they form a shading structure for preventing the dopant of the n conduction type from being introduced into surface regions of the silicon layer 504 between the third and fourth source/drain regions 571, 572. The transistor properties of the SOI field effect transistor shown in the right-hand region of FIG. 5D are defined by setting the thickness "d" of the second spacer layer 551 and by setting the dopant concentration profile during the formation of the third and fourth source/drain regions 571, 572. The ion implantation method is used as a method for implanting the dopant atoms in the third and fourth source/drain regions 571, 572. The dopant concentration profile of the third and fourth source/drain regions 571, 572 can be predetermined by setting the dopant atom type, the energy of the doping atoms and also further method parameters.

The SOI field effect transistor in the left-hand partial region of FIG. 5D has a channel region with a shorter length than the SOI field effect transistor shown in the right-hand partial region of FIG. 5D. The length of the channel region of the left-hand SOI field effect transistor is approximately 2d less than in the case of the right-hand SOI field effect transistor since the additionally applied second spacer layer 551 serves as a shading structure during the introduction of dopant atoms into the right-hand field effect transistor in accordance with FIG. 5D.

Furthermore, it should be noted that the first TEOS protective layer 507 and the second TEOS protective layer 513 have a thickness of approximately 10 nm in order to enable a sufficiently good insulation effect for the layer stack comprising gate-insulating layer and gate region. By contrast, the thickness "d" of the second spacer layer 551 is set in such a way that the right-hand SOI field effect transistor is formed as a low-power field effect transistor. The functionalities of the TEOS protective layers 507, 513, on the one hand, and of the spacer layers 541, 551 are fundamentally different.

A description is given below, referring to FIG. 6A to FIG. 6D, of a second preferred exemplary embodiment of the method according to the invention for producing an SOI field effect transistor with predetermined transistor properties.

The layer sequences 600, 610 shown in FIG. 6A correspond to the layer sequences 500, 510 shown in FIG. 5A.

In order to obtain the layer sequences 620, 630 shown in FIG. 6B, a spacer layer 621 having the thickness "l" is deposited both on the left-hand surface region and on the right-hand surface region of the layer sequences in accordance with FIG. 6B. This is done by using a CVD method ("chemical vapor deposition"). The thickness "l" of the spacer layer 621 is a crucial parameter for setting the length of the channel region of the right-hand SOI field effect transistor in accordance with FIG. 6B. The spacer layer 621 is produced from silicon nitride.

In order to obtain the layer sequences 640, 650 shown in FIG. 6C, the right-hand surface region in accordance with FIG. 6C is covered with a TEOS hard mask 651 (tetraethyl orthosilicate) in order to protect this surface region from etching in a further method step. In a further method step, in the case of the left-hand surface region in accordance with FIG. 6C, the spacer layer 621 made of silicon nitride is removed using a wet-chemical etching method. A wet-chemical etching method of a type which is suitable for etching silicon nitride is used for this purpose, whereas silicon dioxide (i.e. also the TEOS hard mask 651) is protected from etching. As a result, only the spacer layer 621 from the left-hand surface region is removed.

In order to obtain the layer sequences 660, 670 shown in FIG. 6D, firstly the TEOS layer 651 is removed using a suitable etching method. As shown in FIG. 6C, the left-hand laterally delimited layer stack is approximately 2*l narrower than the right-hand layer stack, where l is the thickness of the spacer layer 621. Afterward, both the left-hand layer stack and the right-hand layer stack are subjected to an ion implantation method, thereby forming a first source/drain region 661, a second source/drain region 662, a third source/drain region 663 and a fourth source/drain region 664. The source/drain regions of the left-hand SOI field effect transistor in accordance with FIG. 6C are formed by means of the first and second source/drain regions 661, 662, whereas the source/drain regions of the right-hand SOI field effect transistor in accordance with FIG. 6C are formed by means of the source/drain regions 663, 664. Owing to the functionality of the spacer layer 621 as part of a shading structure, that distance between the two source/drain regions by which the length of the channel region is defined, in the case of the layer sequence 670, is approximately 2*l greater than in the case of the layer sequence 660. Therefore, the SOI field effect transistor 660 has a lower threshold voltage than the SOI field effect transistor 670.

Furthermore, the SOI field effect transistor 670 has a lower leakage current than the SOI field effect transistor 660.

The method described with reference to FIG. 6A to FIG. 6D has the advantage, in particular, that a single common implantation method suffices for forming the source/drain regions of both SOI field effect transistors.

Analogously to the production methods described with reference to FIG. 5A to FIG. 5D and FIG. 6A to FIG. 6D, respectively, a p-channel SOI field effect transistor and an n-channel SOI field effect transistor may also be produced in a CMOS process. Furthermore, a multiple application of the procedure is conceivable in order to produce a still wide spectrum of different components, in particular SOI field effect transistors.

After carrying out the method steps described with reference to FIG. 5A to FIG. 5D and FIG. 6A to FIG. 6D, respectively, it is possible to carry out further process steps that are specific in particular to the thin-film SOI technology, such as the production of "elevated" source/drain regions, siliciding or the formation of a conventional back-end region. When using a gate region made of a metallic material instead of a p$^+$-doped polysilicon germanium gate, the latter is replaced by a metallic gate region.

FIG. 7 shows a layer sequence 700 that is similar to the layer sequence 540 shown in the left-hand region of FIG. 5C.

An essential difference between the layer sequence 700 from FIG. 7 and the layer sequence 540 from FIG. 5C is that, in the case of the layer sequence 700, a spacer sidewall 701 is provided instead of the first spacer layer 541. The spacer sidewall may be obtained for example by etching back the spacer layer 541 from FIG. 5C. The spacer sidewall 701 essentially fulfills the same functionality as the spacer layer 541.

Furthermore, the production of different types of transistor (low-power transistor, high-performance transistor) using a spacer of variable thickness that has been described with reference to FIG. 5A to FIG. 7 can also be applied to other MOSFET variants. Exemplary embodiments thereof are shown in FIG. 8A to FIG. 8C.

Figure 8A:
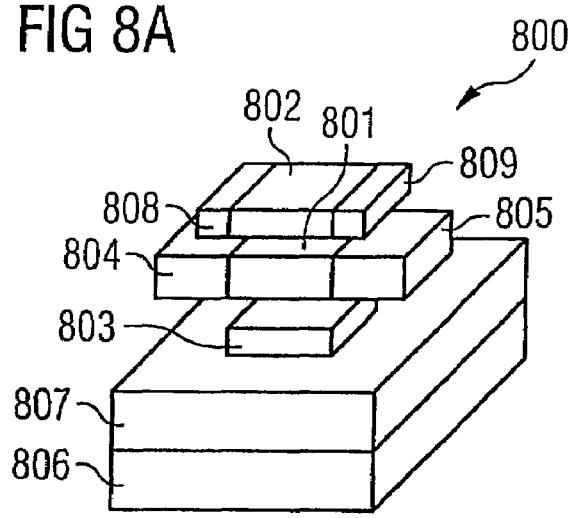
FIG. 8A shows a double gate field effect transistor.

FIG. 8A shows a double gate transistor 800, in which a channel region 801 is surrounded vertically on both sides in a controllable manner by a first gate region 802 and by a second gate region 803. The gate-insulating regions between the first gate region 802 and the channel region 801, on the one hand, and between the second gate region 803 and the channel region 801, on the other hand, are not shown in FIG. 8A. Furthermore, the double gate transistor 800 has a first source/drain region 804 and a second source/drain region 805. Moreover, a silicon substrate 806 and also a silicon dioxide layer 807 on the silicon substrate 806 are provided. Furthermore, a first spacer region 808 made of silicon nitride and a second spacer region 809 made of silicon nitride are provided, by means of which the length of the channel region can be set according to the invention.

Figure 8B:
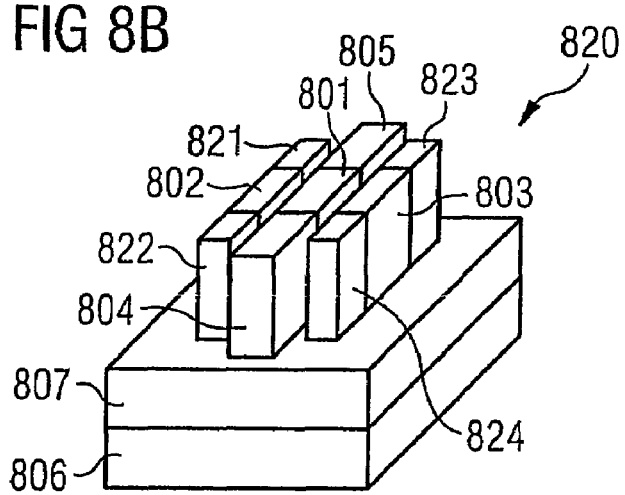
FIG. 8B shows a fin field effect transistor.

Furthermore, FIG. 8B shows a fin field effect transistor (fin-FET). In accordance with fin-FET technology, the current flow through the channel region is controlled from two sides. A type of "forked" design of the gate region distinctly reduces leakage currents through the channel region. FIG. 8B shows in particular a first, a second, a third and a fourth spacer region 821 to 824, it being possible to set the length of the channel region by setting the thickness of the spacer layers 821 to 824.

Figure 8C:
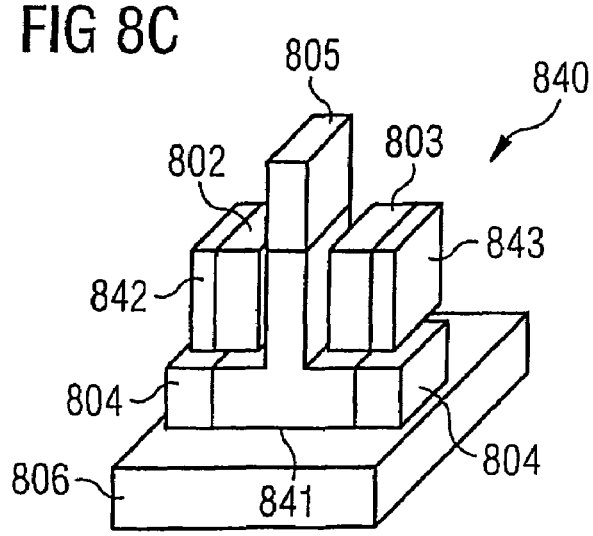
FIG. 8C shows a vertical field effect transistor.

FIG. 8C shows a vertical field effect transistor 840 having a bulk silicon region 841. A first spacer region 842 and a second spacer region 843 are formed on the first and second gate regions 802, 803, respectively, in such a way that the length of the channel region can be set thereby.

The invention claimed is:

1. A method for producing a first fully depleted thin film SOI field effect transistor with predetermined transistor properties, comprising the steps of:

forming a laterally delimited layer sequence with a gate-insulating layer and a gate region on an essentially undored body region having a thickness of less than 20 nm;

forming a spacer layer having a predetermined thickness, on at least a portion of the sidewalls of the laterally delimited layer sequence; and forming two source/drain regions having a predetermined dopant concentration profile, by introducing dopant into two surface regions adjacent the essentially undored body region, which are adjoined by the spacer layer, the layer sequence and the spacer layer forming a shading structure that prevents dopant from being introduced into the essentially undoped body region between the two source/drain regions, wherein the predetermined transistor properties of the first fully depleted thin film SOI field effect transistor are set by setting the thickness of the spacer layer and by setting the dopant concentration profile, wherein a second fully depleted thin film SOI field effect transistor is formed in accordance with the method for producing the first fully depleted thin film SOI field effect transistor on and/or in the essentially undoped body region, the predetermined transistor properties of the second fully depleted thin film SOI field effect transistor being set differently from those of the first fully depleted thin film SOI field effect transistor, wherein the difference in the transistor properties of the first fully depleted thin film SOI field effect transistor and the second fully depleted thin film SOI field effect transistor results solely from the different thicknesses of their spacer layers.

2. A method for producing a first fully depleted thin film SOI field effect transistor with predetermined transistor properties comprising the steps of:

forming a laterally delimited layer sequence with a gate-insulating layer and a gate region on an essentially undored body region having a thickness of less than 20 nm;

forming a spacer layer having a predetermined thickness, on at least a portion of the sidewalls of the laterally delimited layer sequence; and forming two source/drain regions having a predetermined dopant concentration profile, by introducing dopant into two surface regions adjacent the essentially undored body region, which are adjoined by the spacer layer, the layer sequence and the spacer layer forming a shading structure that prevents dopant from being introduced into the essentially undored body region between the two source/drain regions, wherein the predetermined transistor properties of the first fully depleted thin film SOI field effect transistor are set by setting the thickness of the spacer layer and by setting the dopant concentration profile, wherein a second fully depleted thin film SOI field effect transistor is formed in accordance with the method for producing the first fully depleted thin film SOI field effect transistor on and/or in the essentially undored body region, the predetermined transistor properties of the second fully depleted thin film SOI field effect transistor being set differently from those of the first fully depleted thin film SOI field effect transistor, further comprising the steps of forming a third fully depleted thin film SOI field effect transistor in accordance with the method for producing the first fully depleted thin film SOI field effect transistor on and/or in the essentially undoped body region, wherein the predetermined transistor properties of the third fully depleted thin film SOI field effect transistor are set to be analogous to those of the first fully depleted thin film SOI field effect transistor, the conduction types of the first fully depleted thin film SOI field effect transistor and the third fully depleted thin film SOI field effect transistor being complementary to one another.

3. The method as claimed in claim 2, wherein the gate regions of the first fully depleted thin film SOI field effect transistor and of the second fully depleted thin film SOI field effect transistor or of the first fully depleted thin film SOI field effect transistor, of the second fully depleted thin film SOI field effect transistor, and of the third fully depleted thin film SOI field effect transistor are produced from the same material.

4. The method as claimed in claim 3, wherein the material of the gate regions has a value of a work function which is essentially equal to an arithmetic mean of values of a work function of heavily p-doped polysilicon and heavily n-doped polysilicon.

5. The method as claimed in claim 4, wherein the material of the gate region has a work function of between 4.45 electron volts and 4.95 electron volts.

6. The method as claimed in claim 3, wherein the material of the gate regions is germanium, tungsten, tantalum, and/or titanium nitride.

7. A method for producing a first fully depleted thin film SOI field effect transistor with predetermined transistor properties, comprising the steps of:

forming a laterally delimited layer sequence with a gate-insulating layer and a gate region on an essentially undored body region having a thickness of less than 20 nm;

forming a spacer layer having a predetermined thickness, on at least a portion of the sidewalls of the laterally delimited layer sequence; and forming two source/drain regions having a predetermined dopant concentration profile, by introducing dopant into two surface regions adjacent the essentially undored body region, which are adjoined by the spacer layer, the layer sequence and the spacer layer forming a shading structure that prevents dopant from being introduced into the essentially undored body region between the two source/drain regions, wherein the predetermined transistor properties of the first fully depleted thin film SOI field effect transistor are set by setting the thickness of the spacer layer and by setting the dopant concentration profile, wherein a second fully depleted thin film SOI field effect transistor is formed in accordance with the method for producing the first fully depleted thin film SOI field effect transistor on and/or in the essentially undored body region, the predetermined transistor properties of the second fully depleted thin film SOI field effect transistor being set differently from those of the first fully depleted thin film SOI field effect transistor, further comprising the steps of forming a third fully depleted thin film SOI field effect transistor in accordance with the method for producing the first fully depleted thin film SOI field effect transistor on and/or in the essentially undoped body region, wherein the predetermined transistor properties of the third fully depleted thin film SOI field effect transistor are set to be analogous to those of the first fully depleted thin film SOI field effect transistor, the conduction types of the first fully depleted thin film SOI field effect transistor and the third fully depleted thin film SOI field effect transistor being complementary to one another.

8. A method for producing a first fully depleted thin film SOI field effect transistor with predetermined transistor properties comprising the steps of:

forming a laterally delimited layer sequence with a gate-insulating layer and a gate region on an essentially undored body region having a thickness of less than 20 nm;

forming a spacer layer having a predetermined thickness, on at least a portion of the sidewalls of the laterally delimited layer sequence; and forming two source/drain regions having a predetermined dopant concentration profile, by introducing dopant into two surface regions adjacent the essentially undored body region, which are adjoined by the spacer layer, the layer sequence and the spacer layer forming a shading structure that prevents dopant from being introduced into the essentially undored body region between the two source/drain regions, wherein the predetermined transistor properties of the first fully depleted thin film SOI field effect transistor are set by setting the thickness of the spacer layer and by setting the dopant concentration profile, wherein a second fully depleted thin film SOI field effect transistor is formed in accordance with the method for producing the first fully depleted thin film SOI field effect transistor on and/or in the essentially undored body region, the predetermined transistor properties of the second fully depleted thin film SOI field effect transistor being set differently from those of the first fully depleted thin film SOI field effect transistor, wherein the predetermined transistor properties of the first fully depleted thin film SOI field effect transistor and of the second fully depleted thin film SOI field effect transistor are set such that one of the two fully depleted thin film SOI field effect transistors is optimized for a low leakage current and the other for a low threshold voltage.

* * * * *

UNITED STATES PATENT AND TRADEMARK OFFICE
CERTIFICATE OF CORRECTION

PATENT NO.         : 7,416,927 B2
APPLICATION NO.    : 10/948637
DATED              : August 26, 2008
INVENTOR(S)        : Ralf Gottsche et al.

It is certified that error appears in the above-identified patent and that said Letters Patent is hereby corrected as shown below:

At column 10, line 1, "FIG. 3A FIG. 3B," should read -- FIG. 3A and FIG. 3B,--

At column 11, line 52, "FIG. 5D" should read --FIG. 5D,--

At column 14, in Claim 1, line 24, "undored" should read --undoped--

At column 14, in Claim 1, line 31, "undored" should read --undoped--

At column 14, in Claim 2, line 55-56, "properties" should read --properties,--

At column 14, in Claim 2, line 59, "undored" should read --undoped--

At column 14, in Claim 2, line 66, "undored" should read --undoped--

At column 15, in Claim 2, line 3, "undored" should read --undoped--

At column 15, in Claim 2, line 13, "undored" should read --undoped--

At column 15, in Claim 7, line 55, "undored" should read --undoped--

At column 15, in Claim 7, line 63, "undored" should read --undoped--

At column 16, in Claim 7, line 2, "undored" should read --undoped--

At column 16, in Claim 7, line 11, "undored" should read --undoped--

At column 16, in Claim 8, line 29-30, "properties" should read --properties,--

At column 16, in Claim 8, line 33, "undored" should read --undoped--

At column 16, in Claim 8, line 40, "undored" should read --undoped--

UNITED STATES PATENT AND TRADEMARK OFFICE
CERTIFICATE OF CORRECTION

| | |
|---|---|
| PATENT NO. | : 7,416,927 B2 |
| APPLICATION NO. | : 10/948637 |
| DATED | : August 26, 2008 |
| INVENTOR(S) | : Ralf Gottsche et al. |

It is certified that error appears in the above-identified patent and that said Letters Patent is hereby corrected as shown below:

At column 16, in Claim 8, line 44, "undored" should read --undoped--

At column 16, in Claim 8, line 53, "undored" should read --undoped--

Signed and Sealed this

Eleventh Day of November, 2008

JON W. DUDAS
*Director of the United States Patent and Trademark Office*